United States Patent
Dorf et al.

(10) Patent No.: US 9,111,722 B2
(45) Date of Patent: Aug. 18, 2015

(54) THREE-COIL INDUCTIVELY COUPLED PLASMA SOURCE WITH INDIVIDUALLY CONTROLLED COIL CURRENTS FROM A SINGLE RF POWER GENERATOR

(71) Applicant: APPLIED MATERIALS, INC., Santa Clara, CA (US)

(72) Inventors: Leonid Dorf, San Jose, CA (US); Shahid Rauf, Pleasanton, CA (US); Jonathan Liu, Sunnyvale, CA (US); Jason A. Kenney, Sunnyvale, CA (US); Andrew Nguyen, San Jose, CA (US); Kenneth S. Collins, San Jose, CA (US); Kartik Ramaswamy, San Jose, CA (US); Steven Lane, Porterville, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 204 days.

(21) Appl. No.: 13/836,890

(22) Filed: Mar. 15, 2013

(65) Prior Publication Data

US 2013/0278141 A1 Oct. 24, 2013

Related U.S. Application Data

(60) Provisional application No. 61/637,468, filed on Apr. 24, 2012.

(51) Int. Cl.
 *H01J 7/24* (2006.01)
 *H05B 31/26* (2006.01)
 *H01J 37/32* (2006.01)
(52) U.S. Cl.
 CPC ..... *H01J 37/32082* (2013.01); *H01J 37/32183* (2013.01)

(58) Field of Classification Search
 USPC .............. 315/111.21, 111.41; 313/231.31
 See application file for complete search history.

(56) References Cited

U.S. PATENT DOCUMENTS

| | | | |
|---|---|---|---|
| 6,409,933 B1 | 6/2002 | Holland et al. | |
| 6,414,648 B1 | 7/2002 | Holland et al. | |
| 6,462,481 B1 * | 10/2002 | Holland et al. | 315/111.21 |
| 6,463,875 B1 | 10/2002 | Chen et al. | |
| 6,685,798 B1 | 2/2004 | Holland et al. | |
| 6,694,915 B1 | 2/2004 | Holland et al. | |
| 6,893,533 B2 | 5/2005 | Holland et al. | |
| 7,422,654 B2 * | 9/2008 | Lindley et al. | 156/345.46 |
| 8,753,474 B2 * | 6/2014 | Nangoy et al. | 156/345.33 |
| 2004/0182319 A1 | 9/2004 | Kim et al. | |
| 2005/0167051 A1 * | 8/2005 | Hoffman et al. | 156/345.46 |
| 2006/0027168 A1 | 2/2006 | Matsuda et al. | |
| 2007/0257008 A1 * | 11/2007 | Chandrachood et al. | 216/67 |
| 2010/0243162 A1 * | 9/2010 | Koshimizu | 156/345.28 |
| 2011/0201134 A1 * | 8/2011 | Hoffman et al. | 438/5 |
| 2013/0278141 A1 * | 10/2013 | Dorf et al. | 315/111.41 |
| 2013/0278142 A1 * | 10/2013 | Dorf et al. | 315/111.41 |

FOREIGN PATENT DOCUMENTS

WO WO-02084698 A1 10/2012

OTHER PUBLICATIONS

U.S. Appl. No. 13/863,614, filed Apr. 16, 2013, Dorf et al.

* cited by examiner

*Primary Examiner* — Adam Houston
(74) *Attorney, Agent, or Firm* — Robert M. Wallace (57) ABSTRACT

An inductively coupled plasma reactor has three concentric RF coil antennas and a current divider circuit individually controlling currents in each of the three coil antennas by varying only two reactive elements in the current divider circuit.

20 Claims, 13 Drawing Sheets

THREE-COIL INDUCTIVELY COUPLED PLASMA SOURCE WITH INDIVIDUALLY CONTROLLED COIL CURRENTS FROM A SINGLE RF POWER GENERATOR

CROSS-REFERENCE RELATED APPLICATIONS

This application claims the benefit of U.S. Provisional Application Ser. No. 61/637,468 filed Apr. 24, 2012 entitled THREE-COIL INDUCTIVELY COUPLED PLASMA SOURCE WITH INDIVIDUALLY CONTROLLED COIL CURRENTS FROM A SINGLE RF POWER GENERATOR, by Leonid Dorf, et al.

BACKGROUND

The recent growth in size semiconductor wafers in integrated circuit fabrication is making it more difficult to obtain the needed decree of uniformity of plasma process rate across the treated surface of the wafer. The process rate may be an etch rate or a deposit ion rate, for example. Plasma processing tools for processing 300 mm diameter wafers employ a pair of concentric coils, namely an inner coil and an outer coil, to control uniformity of radial distribution of process rate. The RF power levels applied to the different coils are selected to counteract non-uniformities. For 450 mm diameter wafers, we feel that three separately powered RF coils are needed. Separate adjustment of the different RF power levels delivered to the three different coils would provide finer control of uniformity. Impedance matching is required for all three coils. The problem is that operation of the impedance match and control of the different power levels delivered to the different coils is unpredictable and complicated by internal resonances and mutual inductances among the three coils and between the coils and the plasma. A related problem is that varying the three different power levels in an effort to improve uniformity may cause the system to enter resonant modes, in which plasma instabilities can arise. Resonances also cause very high RF voltages to appear on the coils and their circuit elements, which can cause arcing.

SUMMARY

The disclosure is directed to a plasma reactor for processing a workpiece, including a reactor chamber including a cylindrical side wall and a ceiling, an RF power generator and an impedance match tuning circuit including: (a) a match input coupled to the RF power generator and (b) a match output. Three coil antennas are concentrically arranged in three respective concentric zones over the ceiling, each including a conductor having a driven end and a return end, the return end of each of the three coil antennas being connected to a common potential.

A first current branch is provided between the match output and the driven end of a first one of the three coil antennas. In general, the first current branch is a conductor without discrete impedance or reactance elements.

A second current branch includes a first series reactance element and a first variable parallel reactance element, the first series reactance element being coupled in series between the match output and the driven end of a second one of the three coil antennas, the first parallel reactance element being coupled in parallel with the second one of the three coil antennas.

A third current branch includes a second series reactance element and a second variable parallel reactance element, the second series reactance element being coupled in series between the match output and the driven end of a third one of the three coil antennas, the second parallel reactance element being coupled in parallel with the third one of the conductive coil antennas. A current apportionment controller governs the first and second variable parallel reactance elements in accordance with a user interface. The order of the coil antennas may be altered from that recited above.

In a disclosed embodiment, each one of the first and second variable parallel reactance elements is or includes a variable capacitor, while each one of the first and second series reactance elements includes a capacitor.

In one embodiment, the current apportionment controller includes a look-up table storing a sequence of pairs of reactance values of the first and second variable parallel reactance elements. The sequence of pairs of values defines a linear programming sequence in an embodiment. A user interface may be coupled to the current apportionment controller, the user interface being adapted to record a user-selected point along the path and transmit the user-selected point to the current apportionment controller.

In a disclosed embodiment, the sequence of pairs of values defines a path in a 2-dimensional space whose dimensions are the reactance values of the first and second variable parallel reactance elements, respectively. In a disclosed embodiment, the path includes: (a) a reference point at which currents in the three RF coil antennas are at least approximately equal, a first point at which current in the first coil, relative to currents in the second and third coils, is near a maximum, (c) a second point at which current in the second coil, relative to currents in the first and third coils, is near a maximum, and (d) a third point at which current in the third coil, relative to currents in the first and second coils, is near a maximum.

An alternative embodiment further includes an interface for entering a desired apportionment of currents in the three RF coil antennas. In this embodiment, the apportionment controller includes a memory containing data representing respective currents in the three RF coil antennas relative to total current for different values of the two variable reactance elements, and a processor for determining from the data the values of the first and second variable parallel reactance elements at which the respective currents in the three coil antennas at least nearly correspond to the desired apportionment.

The impedance match tuning circuit in one embodiment further includes: (a) a first variable tuning capacitor connected to the RF generator power output and a first tuning inductor connected in series between the first variable tuning capacitor and the match output, and a second tuning inductor connected in parallel with the combination of the first variable tuning capacitor and the first tuning inductor; and (b) a second variable tuning capacitor connected to the power output and a third tuning inductor connected in series between the second variable tuning capacitor and ground. The reactor further includes an SHE detector coupled to the RF power generator output, and a match controller responsive to the SHE detector and governing the first and second variable tuning capacitors.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1A:
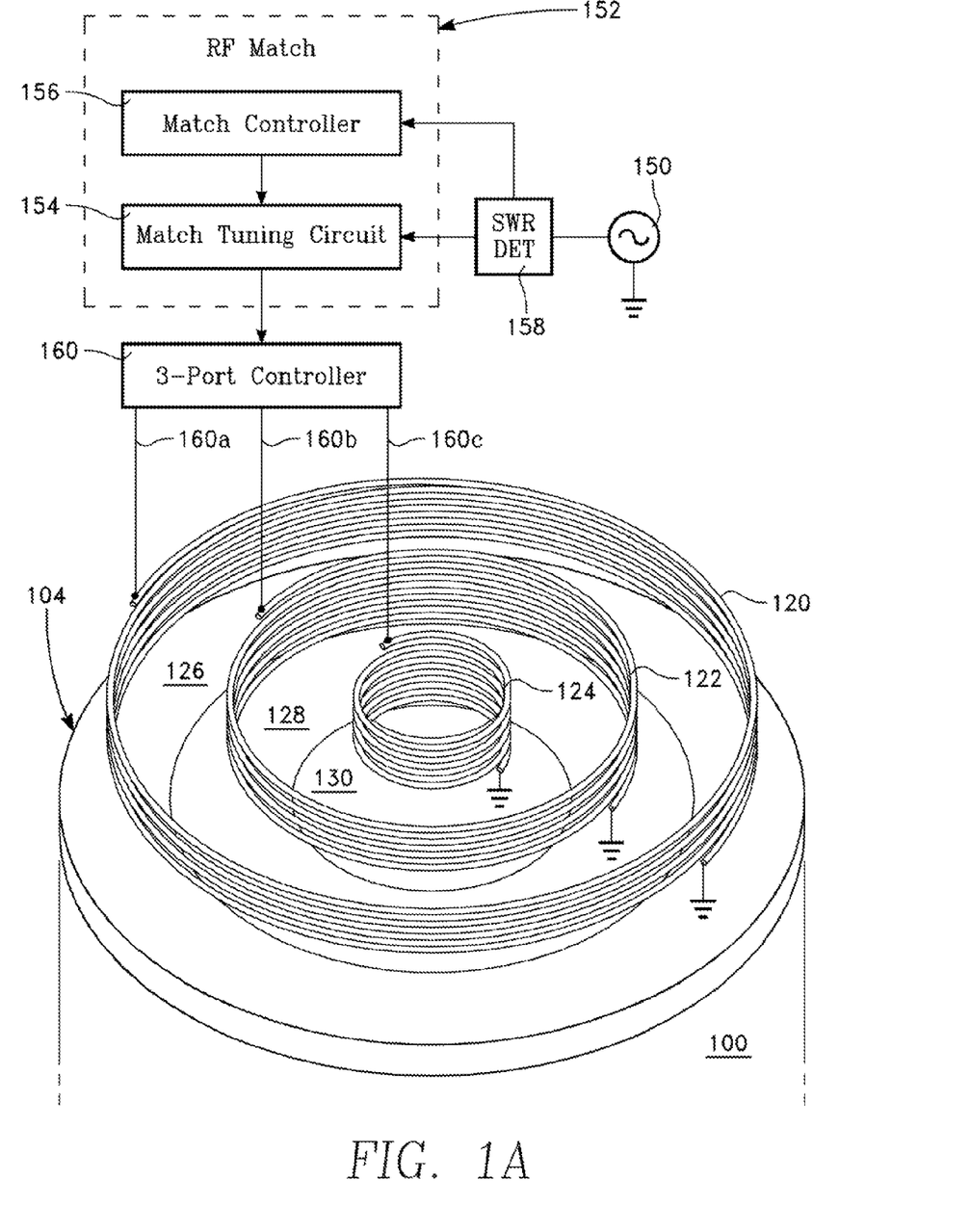
FIGS. 1A, 1B and 1C depict a plasma reactor in accordance with one embodiment.
Figure 1B:
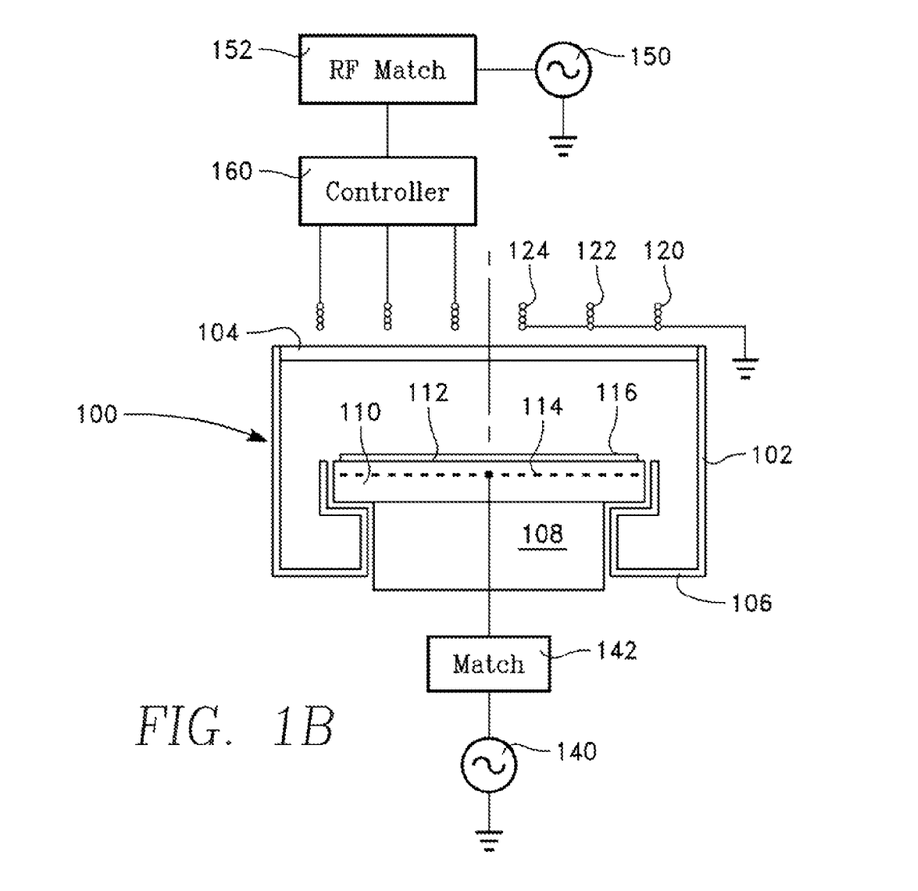
Figure 1C:
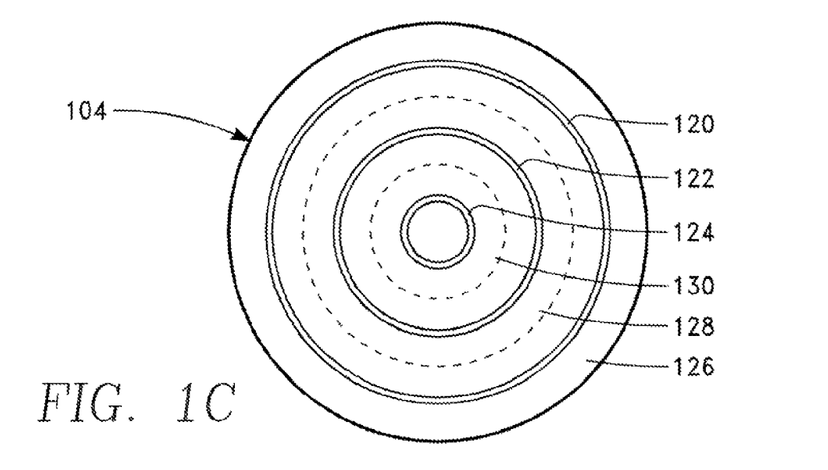

Referring to FIGS. 1A and 1B, a plasma reactor includes a vacuum chamber enclosure 100 including a cylindrical side wall 102, a disk shaped ceiling 104 and a chamber floor 106. A support pedestal 108 extends through the floor and holds a workpiece support 110 having a workpiece support surface 112 and an internal workpiece support electrode 114 beneath and insulated from the support surface 112. A planar workpiece 116, such as a semiconductor wafer, a photolithographic mask, a precursor for a plasma display or a solar cell array, may be held on the support surface 112 for plasma processing. Three (or more) RF coil antennas 120, 122, 124, are disposed over the ceiling 104 in alignment with respective concentric circular (annular) zones 126, 128, 130 (FIG. 1C) coaxial with an axis of symmetry of the chamber enclosure 100.

In one embodiment, an RF bias power generator 140 is coupled through a RF bias impedance match 142 to the workpiece support electrode 114.

An RF source power generator 150 has an output terminal coupled through an RF impedance match 152 to a three port controller 160 and return terminal connected to RF ground. The impedance match 152 consists of a match tuning circuit 154 and a match controller 156 governing the match tuning circuit 154 in accordance with the output of a standing wave ratio (SWR) detector 158 disposed at or in series with the output of the RF source power generator 150. The SWR detector 158 measures the ratio between forward and reflected power or voltage, and may be a conventional RF device such as a dual directional coupler, for example. The three port controller 160 has three outputs 160a, 160b and 160c coupled to the three RF coils 120, 122 and 124 respectively. The currents provided at the outputs 160a, 160b and 160c are separately adjustable relative to total current, as will be described below.

Figure 2:
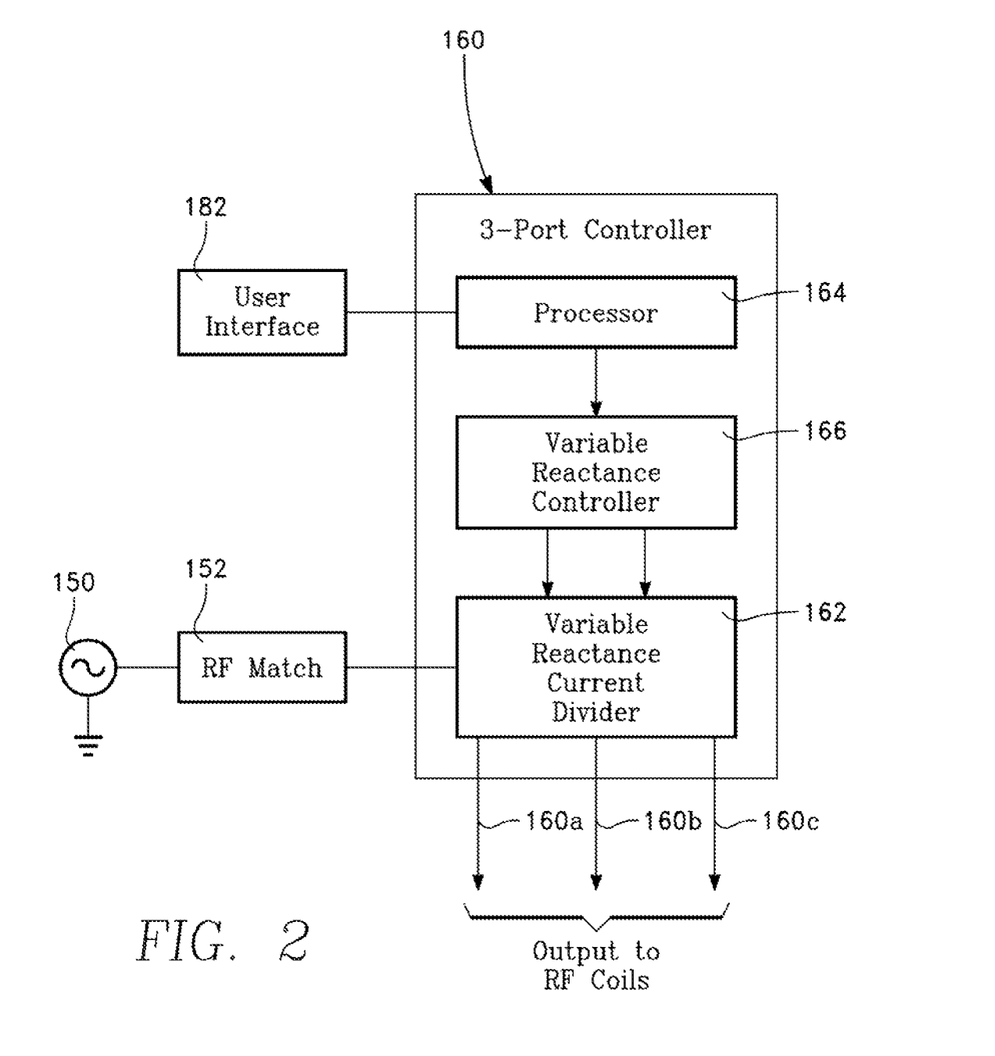
FIG. 2 is a schematic block diagram depicting an embodiment of a 3-port controller of FIG. 1A.

Referring to FIG. 2, the three port controller 160 includes a variable reactance current divider 162 coupled between the output of the impedance match 152 and the outputs 160a, 160b and 160c. As will be described in detail below, the variable reactance current divider 162 includes plural variable reactive elements (not shown in FIG. 2) such as variable capacitors or variable inductors, whose adjustment controls the apportionment of currents at the three outputs 160a, 160b and 160c. This adjustment is performed under control of a processor 164, in response to user preferences for apportionment of currents among the three RF coil antennas 120, 122 and 124. As will be described in detail below, the processor 164 may translate a user preference for apportionment of the three currents to specific values of the variable reactances of the variable reactance current divider 162. A variable reactance controller 166 may convert the specific variable reactance values furnished by the processor 164 to corresponding commands that produce the desired reactance values in the variable reactance current divider 162. For example, the variable reactance elements may be capacitors with stepper motors governed by the commands. In the most practical embodiment, the user may control the variable reactances by following a pre-established linear programming path that covers nearly all possibilities, as will be described later in this specification.

Figure 3A:
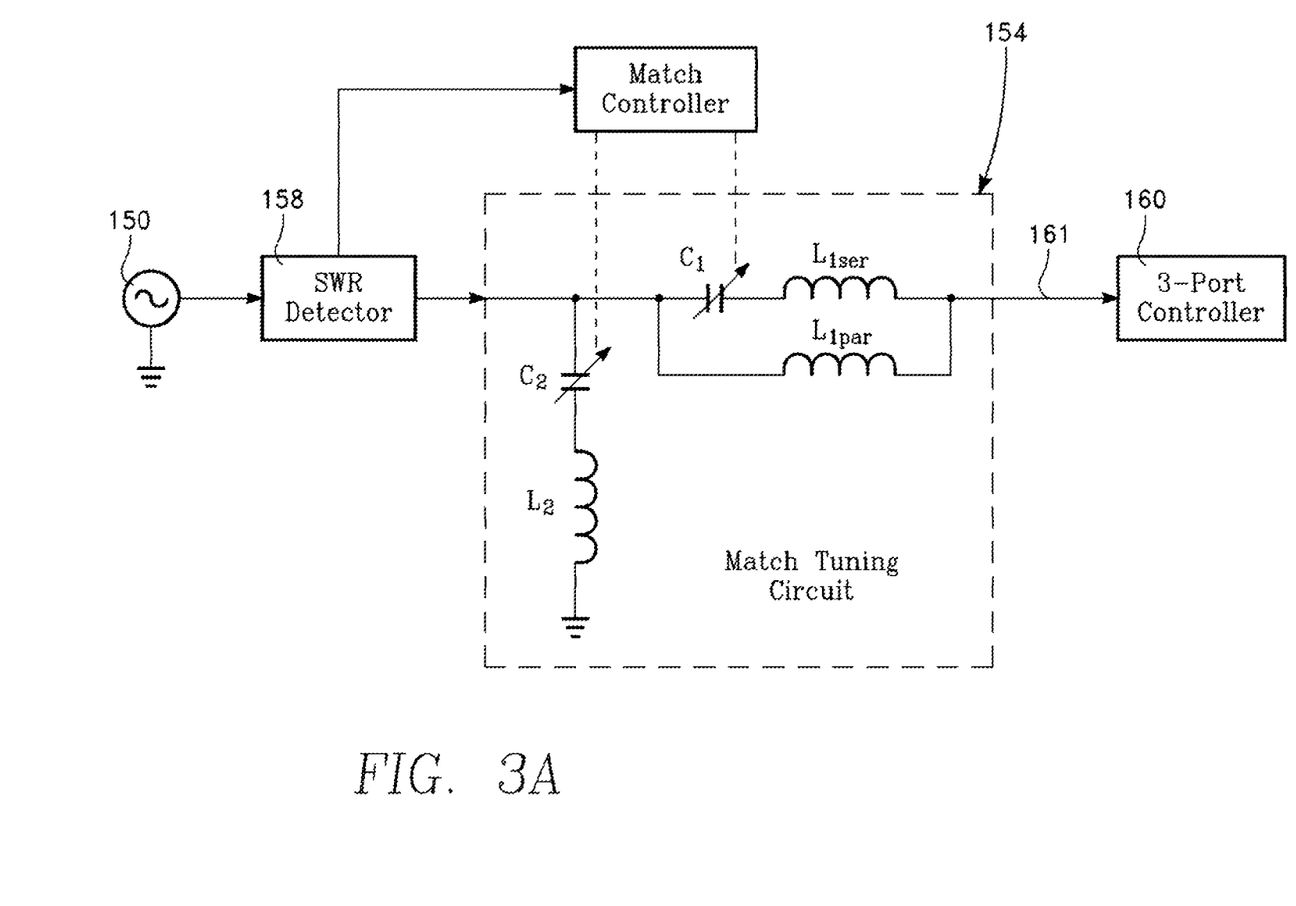
FIG. 3A is a schematic diagram depicting internal structure in one embodiment of an impedance match of FIG. 1A.

An embodiment of the match tuning circuit 154 is depicted in FIG. 3A, and an embodiment of the variable reactance current divider 162 is depicted in FIG. 3B. The at tuning circuit 154 of FIG. 3A includes a variable load capacitor C1 connected in series with a series inductor L1ser between the RF source power generator 150 and a power input 161 of the three port controller 160. A parallel inductor L1par is connected across the series combination of the load capacitor C1 and the inductor L1ser. The match tuning circuit 154 further includes a variable tune capacitor C2 coupled between the output terminal of the RF generator 150 and RF ground through a series inductor L2.

Figure 3B:
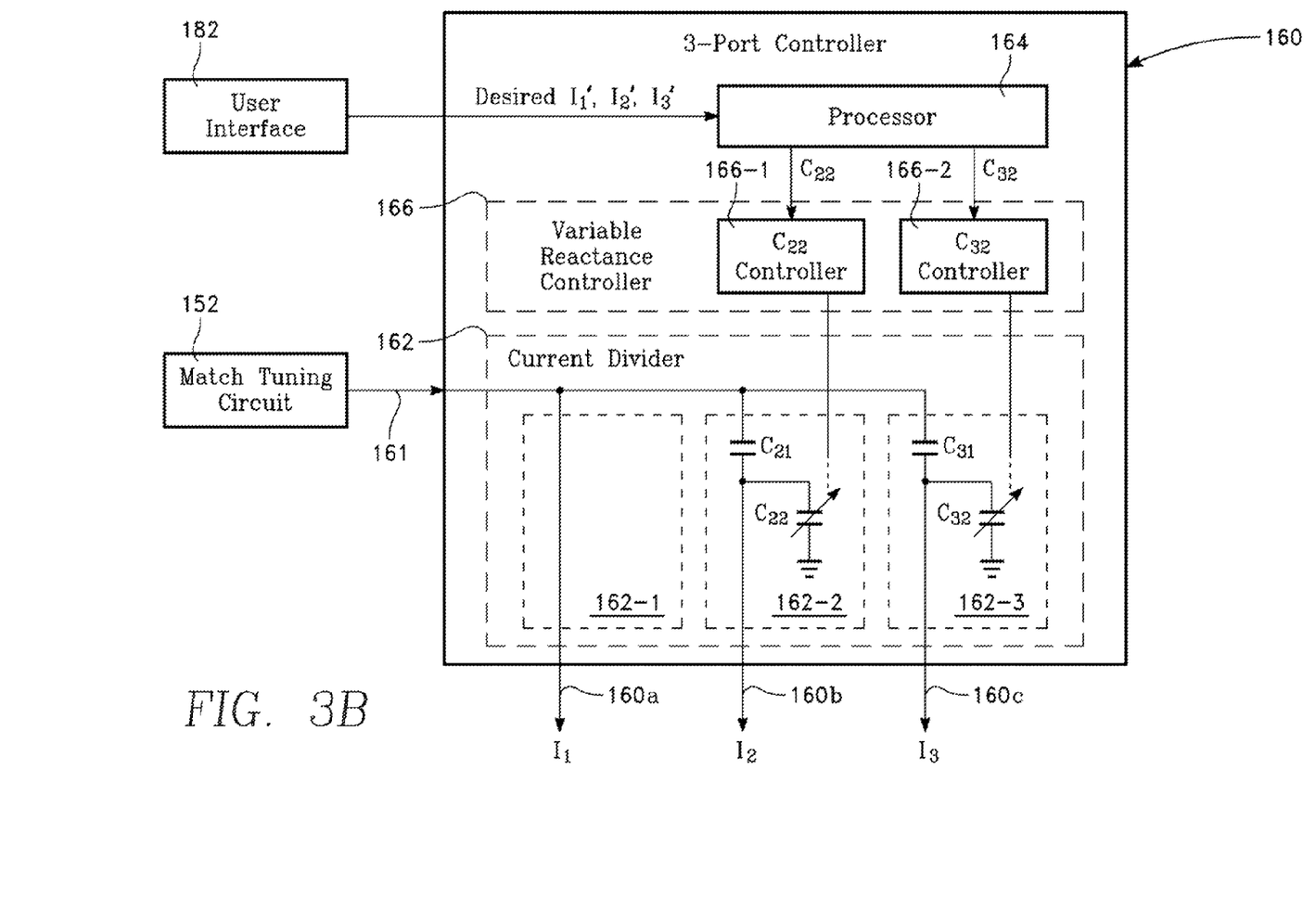
FIG. 3B is a schematic diagram depicting internal structure in one embodiment of the three port controller of FIG. 2.

The variable reactance current divider 162 has three parallel branches 162-1, 162-2 and 162-3 coupled between the power input 161 and the three outputs 160a, 160b and 160c to the respective RF coils 120, 122 and 124. The first branch 162-1 has no discrete impedance elements and is simply a conductor providing in effect a D.C. short. The second branch 162-2 consists of a series reactive element connected in series with the middle coil 122 and a parallel variable reactive element connected in parallel with the middle coil 122. In the illustrated embodiment of the second branch 162-2, the series reactive element is a capacitor C21 while the parallel variable reactive element is a variable capacitor C22. Similarly, the third branch 162-3 consists of a series reactive element connected in series with the inner coil 124 and a parallel variable reactive element connected in parallel with the inner of 124. In the illustrated embodiment of the third branch 162-3, the series reactive element is a capacitor C31 while the parallel variable reactive element is a variable capacitor C32. In the embodiment of FIG. 3B, the variable reactance controller 166 includes a first controller 166-1 that translates a first capacitance value received from the processor 164 to a command for the variable capacitor C22, and a second controller 166-2 that translates another capacitance value received from the processor 164 to command for the variable capacitor C32.

Figure 4:
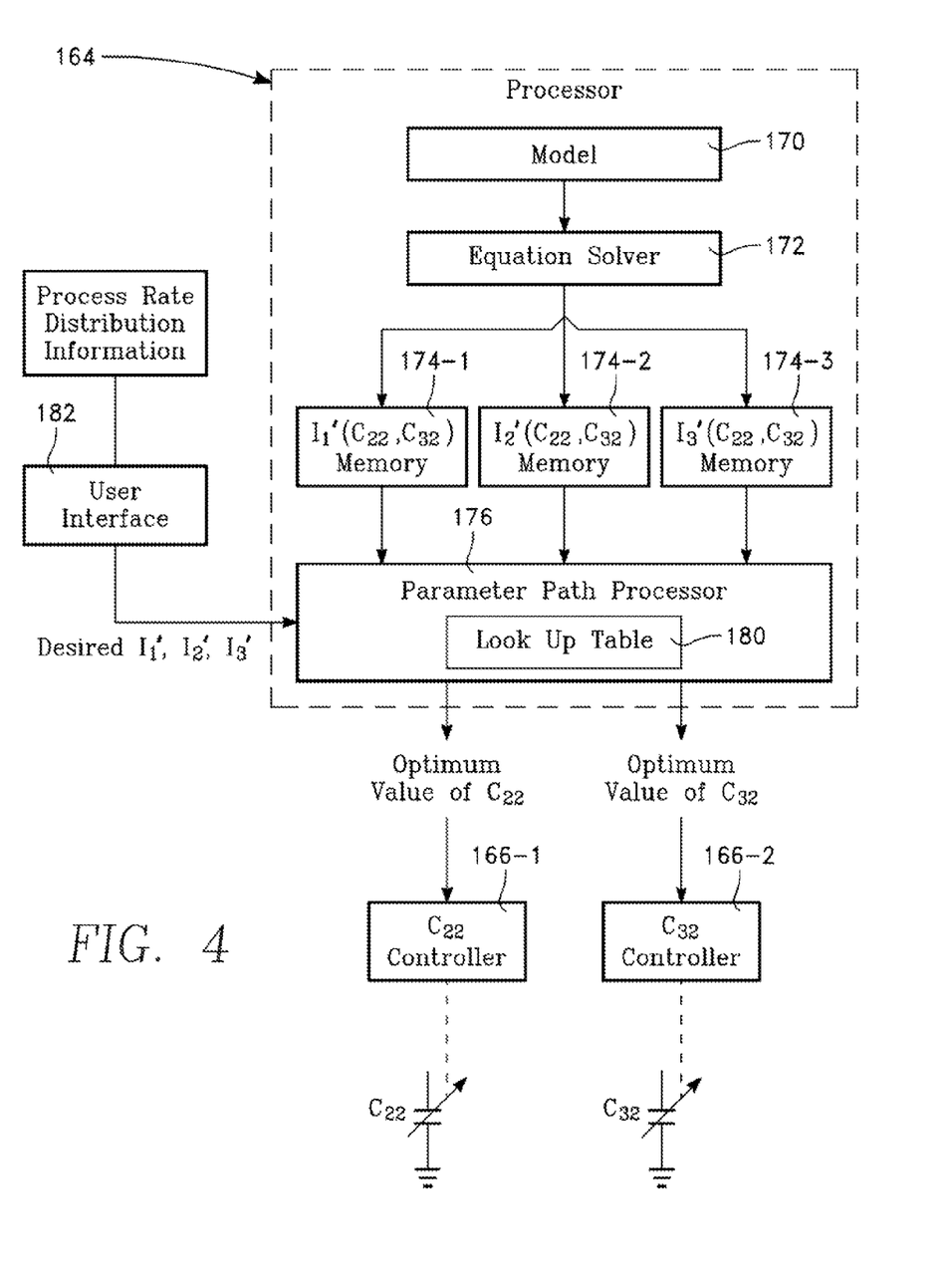
FIG. 4 is a schematic block diagram depicting architecture of an embodiment of a processor of the three port controller of FIG. 2.

In the embodiment of FIG. 4, the processor 164 may optionally include a mathematical model 170 of the system including the variable reactance current divider 162, and an equation solver 172 adapted to employ conventional numerical methods to solve the simultaneous equations constituting the mathematical model 170. The results are stored in look-up tables, as will be described below. The look-up tables may be used to obtain the best values for the variable capacitors C22 and C32 to realize a desired apportionment of currents among the different coils. As plasma conditions (particularly pressure) change, the values predicted using the results stored in the look-up tables become less accurate. But modest inaccuracies can be compensated by the user employing methods described below, without redoing the calculations involving the model. However, if plasma conditions change significantly or radically, then a new set of results must be obtained from the model (using conventional numerical methods to solve the simultaneous equations constituting the mathematical model 170), based upon the latest values of plasma conditions (e.g., chamber pressure). The look-up tables are then updated.

The mathematical model 170 is derived in accordance with the topology of the current divider 162 and the plasma, and is as follows:

$$R_1 I_1 + i\omega \sum_{i=1-6} M_{1i} I_i = V_C \quad (1.)$$

$$\left(R_2 + \frac{1}{i\omega(C_{21} + C_{22})}\right) I_2 + i\omega \sum_{i=1-6} M_{2i} I_i = V_C \frac{C_{21}}{(C_{21} + C_{22})} \quad (2.)$$

$$\left(R_3 + \frac{1}{i\omega(C_{31} + C_{32})}\right) I_3 + i\omega \sum_{i=1-6} M_{3i} I_i = V_C \frac{C_{31}}{(C_{31} + C_{32})} \quad (3.)$$

$$Z_p I_p + i\omega \sum_{i=1-6} M_{pi} I_i = 0 \quad (4.)$$

$V_C$ is the voltage at the power input 161.

The foregoing model is based upon current functions including the complex term $e^{i\omega t}$, so that all current functions, $I_i$ and $I_p$ are actually the corresponding complex amplitudes. For any current function, the actual current that corresponds to it is given by $Re\{I_i\, e^{i\omega t}\}$. The useful result of solving the model 170 is the magnitudes of the three coil currents $[I_i]$ for $i=1, 2, 3$, which are denoted simply as $I_1, I_2, I_3$, in bold font.

Figure 5:
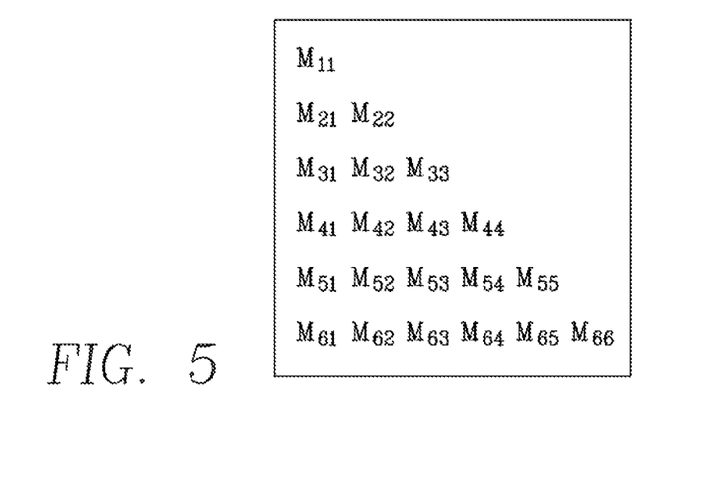
FIG. 5 depicts a matrix of mutual inductances in a model employed in the processor of FIG. 4.
Figure 6:
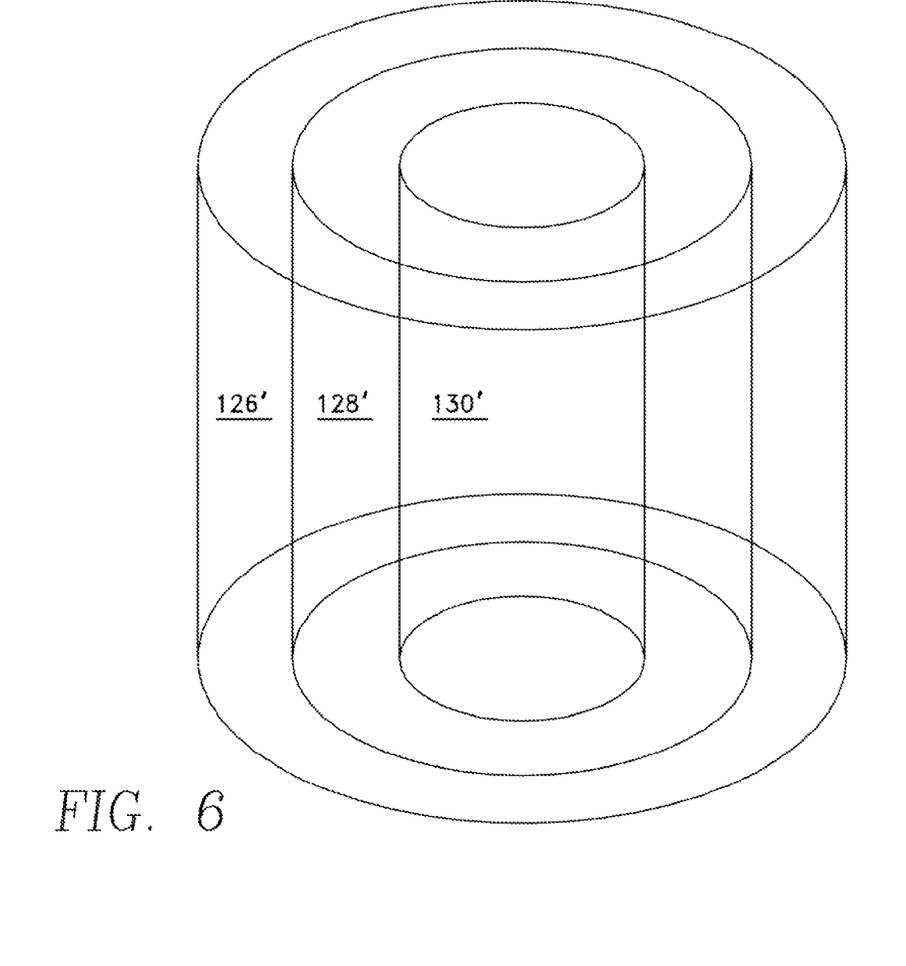
FIG. 6 depicts a definition of three plasma sections aligned with the three RF coil antennas for modeling plasma elements in the matrix of FIG. 5.

The matrix M is depicted in FIG. 5, and is symmetrical across its diagonal, and only the lower diagonal half is depicted in FIG. 5 for the sake of simplicity. The off-diagonal elements in the matrix M in the foregoing model are the mutual inductances among the three RF coils 120, 122 and 124 and the three sections of the plasma in the reactor chamber 100 underlying the three circular/annular zones 126, 128 and 130 under the respective coils. Elements on the matrix diagonal are self-inductances. The division of the plasma into three corresponding solid sections 126', 128' and 130' is depicted in FIG. 6. The subscripted indices of the matrix elements in M denote the elements mutually coupled as follows: the three coils 120, 122 and 124 correspond to indices 1, 2 and 3 respectively; the three plasma sections 126', 128' and 130' correspond to indices 4, 5 and 6, respectively. Each of the matrix elements is computed based upon the geometry of the reactor. In turn, the plasma impedance, $Z_p$, depends upon the pressure in the chamber containing the plasma.

Equation (1) expresses the voltage drops attributable to current in the first coil 120 and the mutual inductances involving the first coil 120. Equation (2) expresses the voltage drops attributable to current in the second coil 122 and the mutual inductances involving the second coil 122. Equation (3) expresses the voltage drops attributable to current in the third coil 124 and the mutual inductances involving the third coil 124. Equation (4) expresses, in a compressed manner, the voltage drops attributable to individual currents through the plasma sections 126', 128' and 130' and the mutual inductances involving the respective plasma sections.

Equation (4) is actually three equations, one for each value of the subscripted index p, ranging from 4 to 6, corresponding to the three plasma sections 126', 128' and 130'. In equation (4), the $Z_p$ is the complex plasma impedance, and is computed from the plasma resistance $R_p$ as follows:

$$Z_p = R_p(1 + j\omega/\nu)$$

where $j = (-1)^{1/2}$, $\omega$ is the angular frequency of the RF source power generator 150, and $\nu$ is the mean electron collision frequency in the plasma. The plasma resistance $R_p$ of each plasma section and the collision frequency $\nu$ is determined from plasma conditions in accordance with conventional principles. In particular, the collision frequency $\nu$ is determined from the pressure of chamber containing the plasma. Thus, the complex plasma impedance is a function of pressure. The model provides accurate results if an accurate value of chamber pressure was used to determine the plasma resistance $R_p$ and the model may continue to be used until a significant change in chamber pressure is sensed by the processor 164. When that occurs, the equations of the model most be updated according to the latest values of plasma conditions (e.g., pressure), and solved. The processor 164 may monitor chamber pressure using a pressure sensor (not illustrated) coupled to or inside of she chamber, to determine whether the model needs to be updated.

Figure 7:
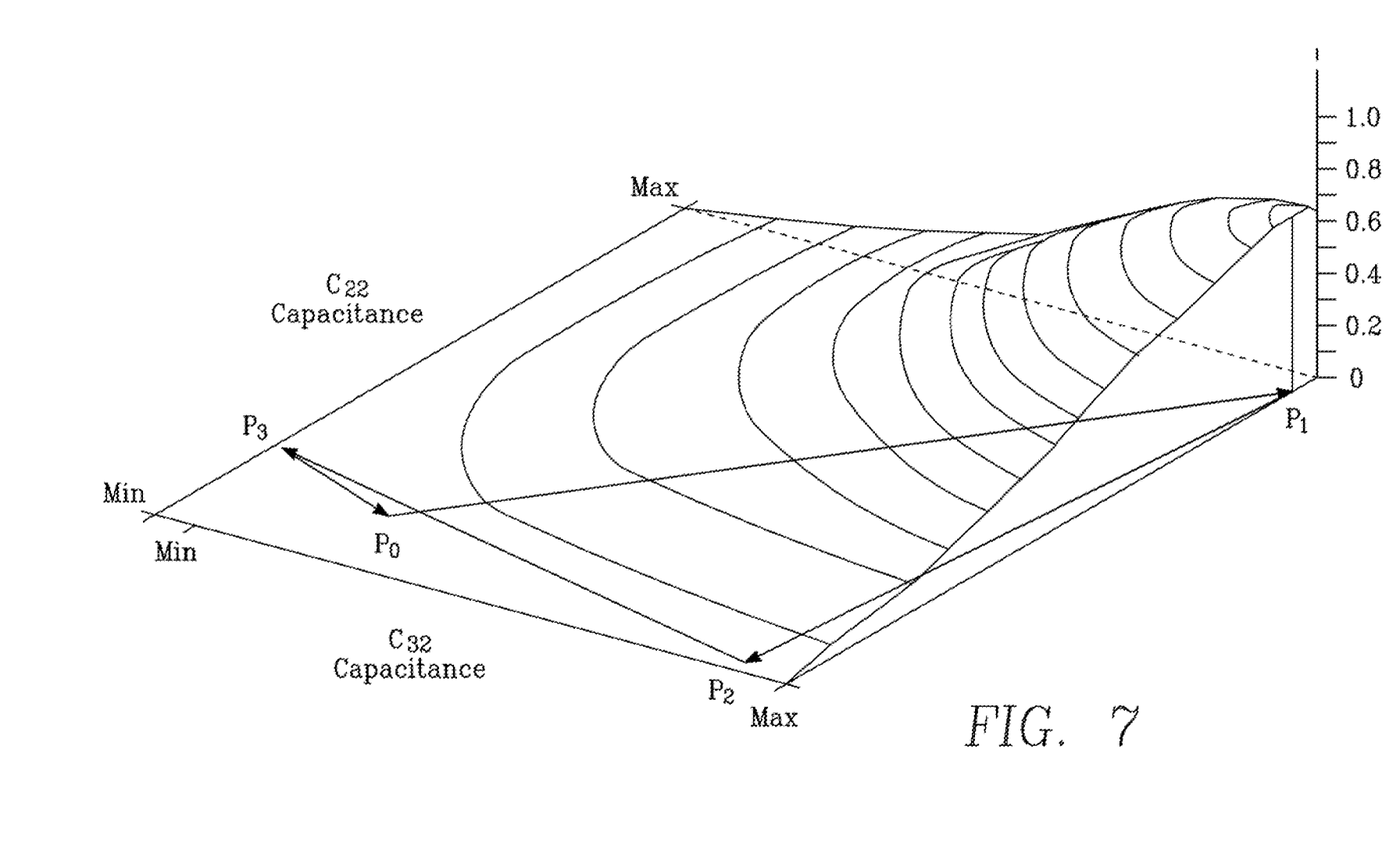
FIG. 7 illustrates an example of the outer coil current as a 3-dimensional function of the values of two variable capacitors in a current divider of FIG. 3B, relative to total current in all three coils.
Figure 8:
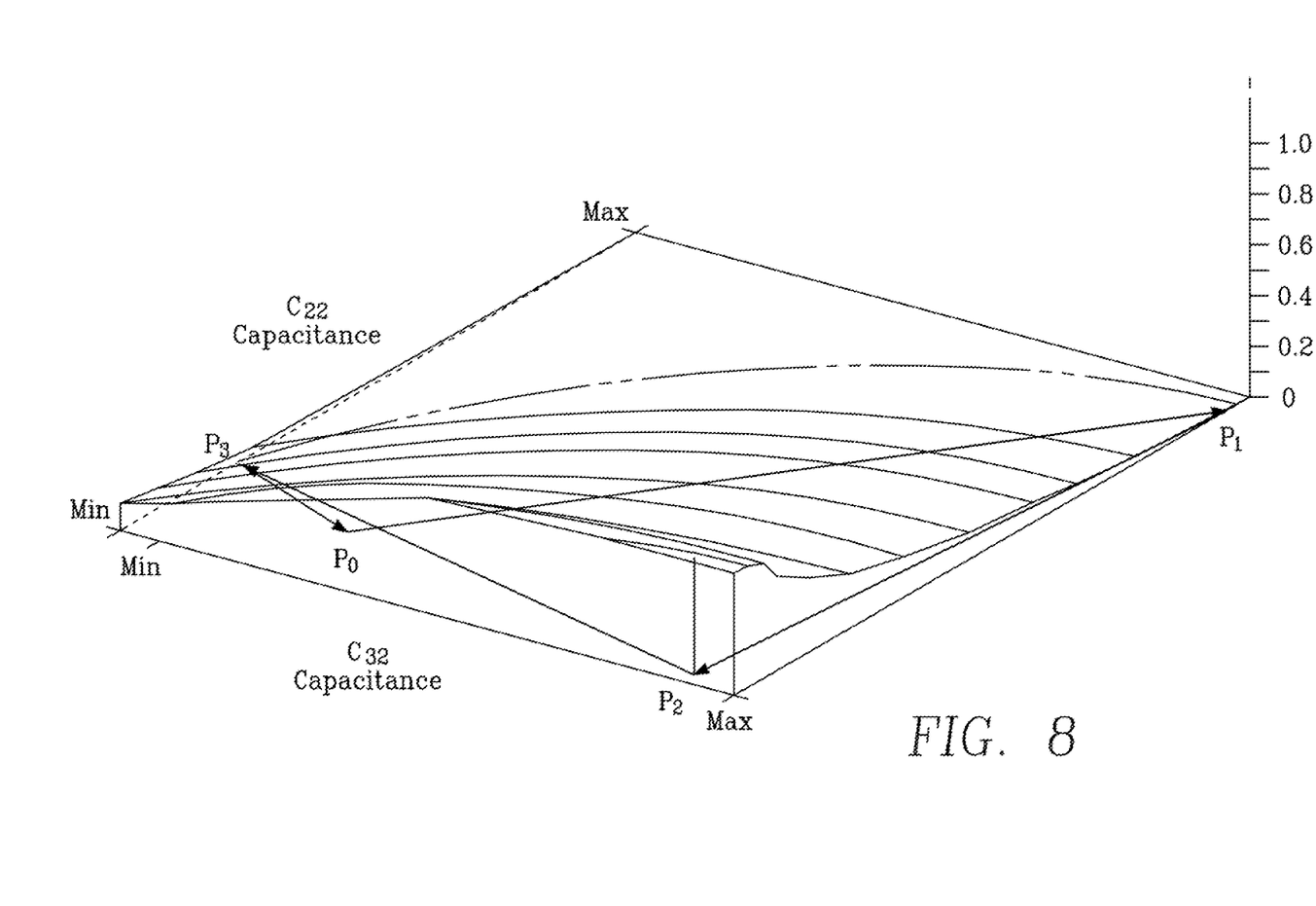
FIG. 8 illustrates an example of the middle coil current as a 3-dimensional function of the values of two variable capacitors in the current divider of FIG. 3B, relative to total current in all three coils.
Figure 9:
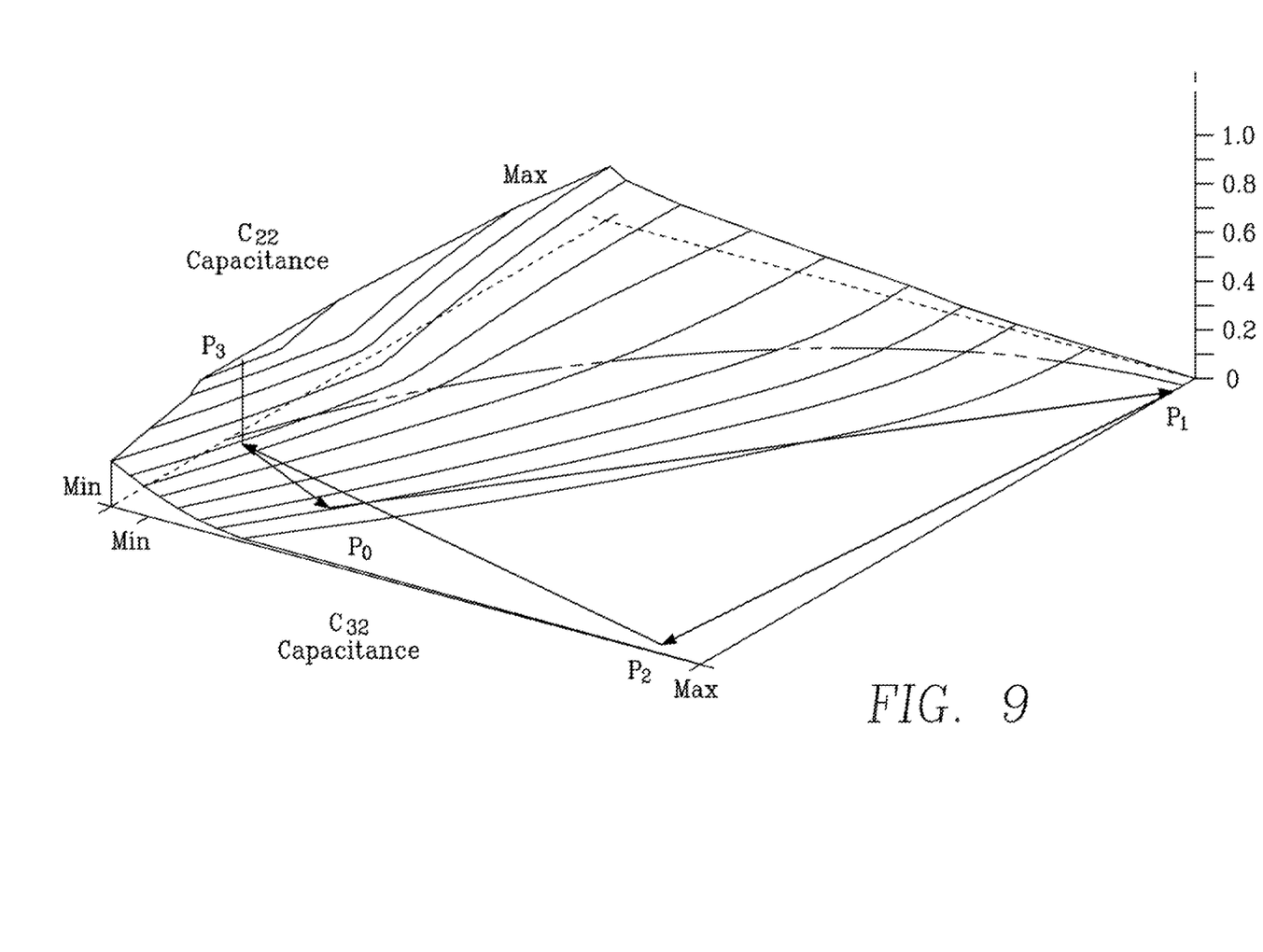
FIG. 9 illustrates an example of the inner coil current as a 3-dimensional function of the values of two variable capacitors in a current divider of FIG. 3B, relative to total current in all three coils.

Returning now to FIG. 4, in one embodiment, the equation solver 172 is adapted to solve the simultaneous equations of the model 170 for the three coil currents as three two-dimensional functions $I_1$, $I_2$ and $I_3$ of the values of the two variable capacitors $C_{22}$ and $C_{32}$. The three coil current functions are normalized to the total current through all three coils, and are denoted $I_1'$, $I_2'$, $I_3'$, respectively. Thus, $$I_i' = I_i / [I_1 + I_2 + I_3]$$

for each value of the index $i=1-3$. Each two dimensional function $I_1'$, $I_2'$, $I_3'$ is stored in a respective memory 174-1, 174-2 and 174-3. A working example of the two dimensional functions $I_1'$, $I_2'$ and $I_3'$ stored in the memories 174-1, 174-2 and 174-3 is depicted in the graphs of FIGS. 7, 8 and 9 respectively. In each one of FIGS. 7, 8 and 9, a plane is defined by two axes labeled $C_{22}$ (the vertical axis) and $C_{32}$ (the horizontal axis), and may be referred to as the $(C_{22}, C_{32})$-plane or two-dimensional ($C_{22}$, $C_{32}$)-space. The magnitude of the coil current in each graph of FIGS. 7-9 is depicted on an axis orthogonal to the ($C_{22}$, $C_{32}$)-plane.

FIGS. 7, 8 and 9 demonstrate a remarkable aspect of our discovery, namely that only two variable capacitors, $C_{22}$ and $C_{32}$ are needed to realize nearly all possible apportionments of the three coil currents $I_1'$, $I_2'$ and $I_3'$. The ability to cover such a large range of apportionments is due in part to the relatively gradual slopes characterizing the peaks in each of the graphs of FIGS. 7-9.

Figure 10:
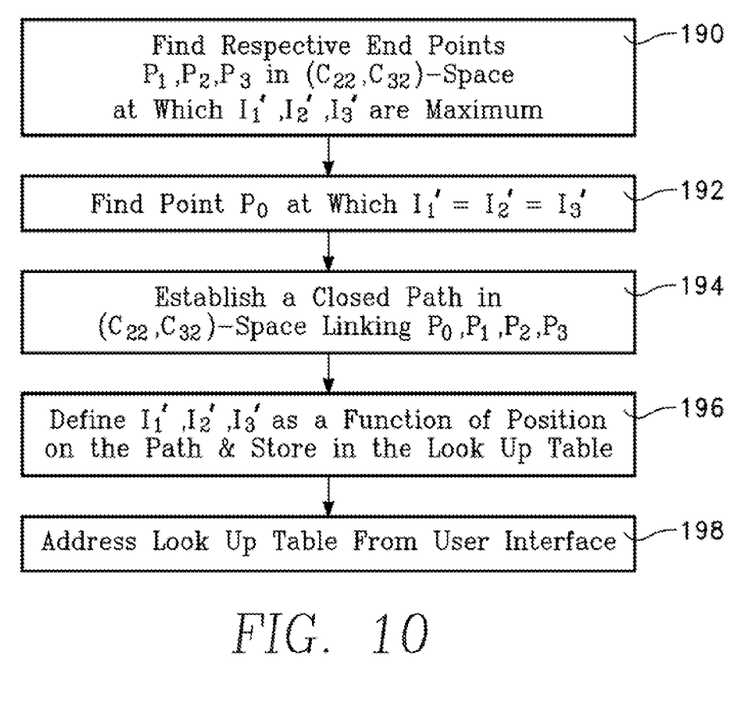
FIG. 10 depicts a method for programming and operating a programmable path processor.

One problem is how to easily find the pair of capacitor values for $C_{22}$ and $C_{32}$ (out of all possible combinations) that provides the exact (or nearly exact) apportionment of $I_1'$, $I_2'$ and $I_3'$ specified by the user. This problem is solved in a first embodiment by a parameter path processor 176. Referring to FIG. 10, the parameter path processor 176 can be implemented by software or by a human operator as follows: Find three respective points P1, P2 and P3 in two-dimensional ($C_{22}$, $C_{32}$)-space at which a respective one of $I_1'$, $I_2'$ and $I_3'$ is maximum (block 190 of FIG. 10). Find a point P0 in two-dimensional ($C_{22}$, $C_{32}$)-space at which, at least approximately, $I_1'=I_2'=I_3'$ (block 192 of FIG. 10). Next, establish a linear programming path in two-dimensional ($C_{22}$, $C_{32}$)-space that includes all four points P0, P1, P2 and P3 (block 194 of FIG. 10). Preferably, the path segments between pairs of the points P0, P1, P2 and P3 are straight lines. A user may then vary $C_{22}$ and $C_{32}$ along the pre-established linear programming path by varying only one parameter, until a desired apportionment of $I_1'$, $I_2'$ and $I_3'$ is found (e.g., by trial and error). The user may need to depart from the programming path to obtain optimum results, particularly if the plasma operating conditions (e.g., chamber pressure) used to implement the model have changed after the look-up tables were generated from the model.

In another embodiment, the parameter path processor 176 uses the two-dimensional functions of $I_1'$, $I_2'$ and $I_3'$ to calculate corresponding discrete values of $I_1'$, $I_2'$ and $I_3'$ at successive points along the lineal programming path and stores these values in a look-up table 180 as a function of position along the linear programming path processor (block 196 of FIG. 10). In one embodiment, during operation, a desired value of $C_{22}$ and $C_{32}$ may be found quickly by addressing the look-up table with a discrete set of desired values of $I_1'$, $I_2'$ and $I_3'$ provided from a user interface 182 (block 198 of FIG. 10).

Figure 11:
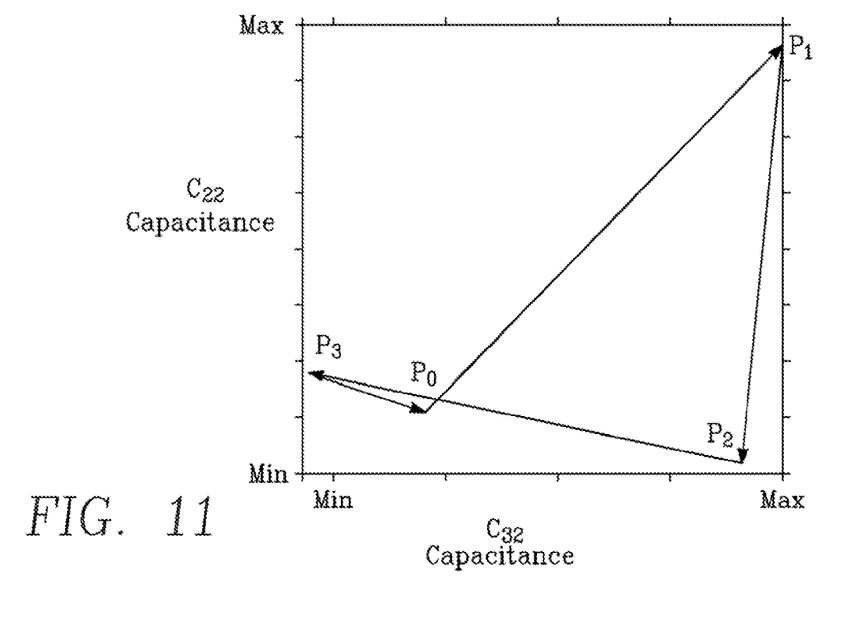
FIG. 11 is a graph depicting a linear programming path be a scalar programming parameter employed in one embodiment of the processor of FIG. 4.
Figure 12A:
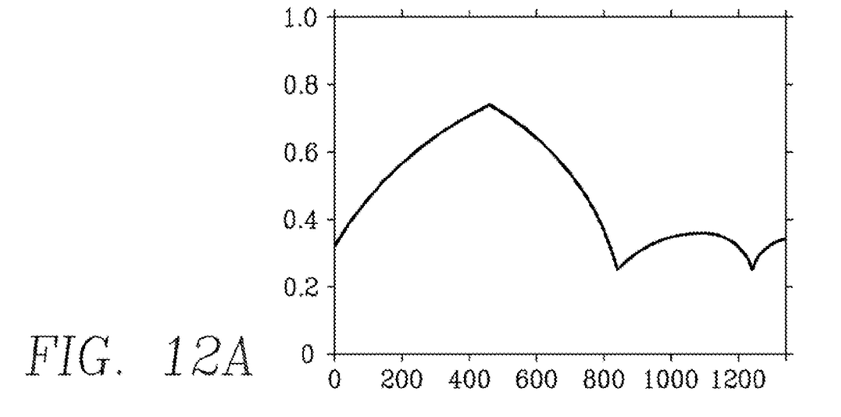
FIG. 12A is a graph depicting the current in the outer coil as a function of position along the programming path of FIG. 10, relative to total current in all three coils.
Figure 12B:
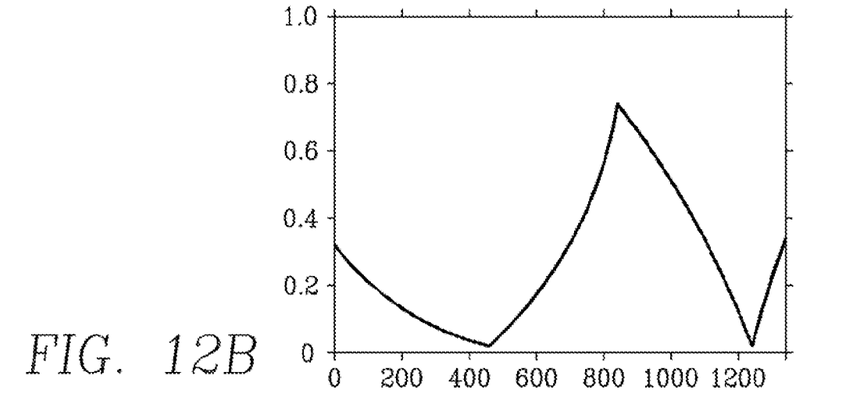
FIG. 12B is a graph depicting the magnitude of the current in the middle coil as a function of position along the programming path of FIG. 10, relative to total current in all three coils.
Figure 12C:
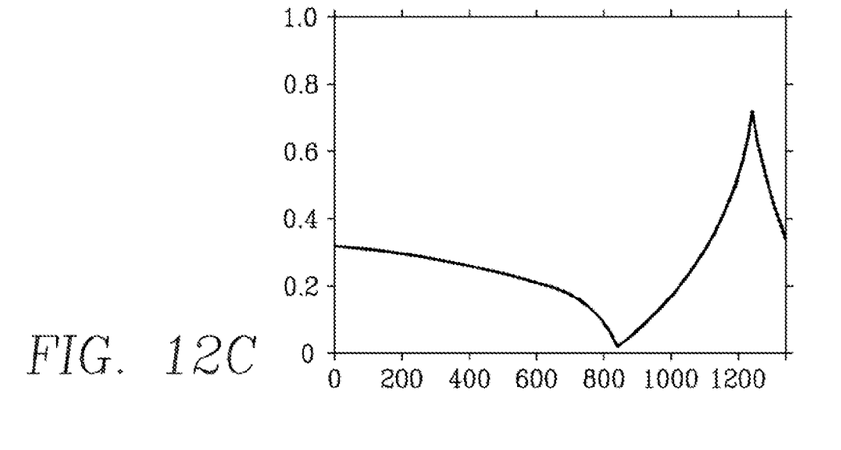
FIG. 12C is a graph depicting the current in the inner coil as a function of position along the programming path of FIG. 10, relative to total current in all three coils.

An example of a linear programming path is depicted in FIG. 11 lying in the ($C_{22}C_{32}$)-plane, and corresponds to the locations of peaks in each of the graphs of FIGS. 7-9. The same linear programming path is superimposed on the ($C_{22}$, $C_{32}$)-plane in each of FIGS. 7-9. FIGS. 12A, 12B and 12C are graphical representations of the contents of the look-up table 180 of FIG. 4 for $I_1'$, $I_2'$ and $I_3'$, respectively. For each position along the linear programming path of FIG. 11 (horizontal axis of FIGS. 12A-12C), a corresponding discrete magnitude of a respective one of $I_1'$, $I_2'$ and $I_3'$ (vertical axis) is given.

In one embodiment, once a representation of the linear programming path of FIG. 11 is stored in the look-up table 180, the other components of the processor 164 may be deactivated or removed, and only the look-up table 180 is required for complete control, unless or until operating conditions or reactor geometries are significantly altered. Thus, in a highly economical implementation, the look-up table 180 is programmed in the factory in the manner previously described with reference to blocks 190-196. Then, the components of the processor 164 are removed with the exception of the look up table 180, and the reactor is shipped. Variations in processing conditions may be accommodated by furnishing different look-up tables that have been programmed in accordance with the different processing conditions.

Figure 13:
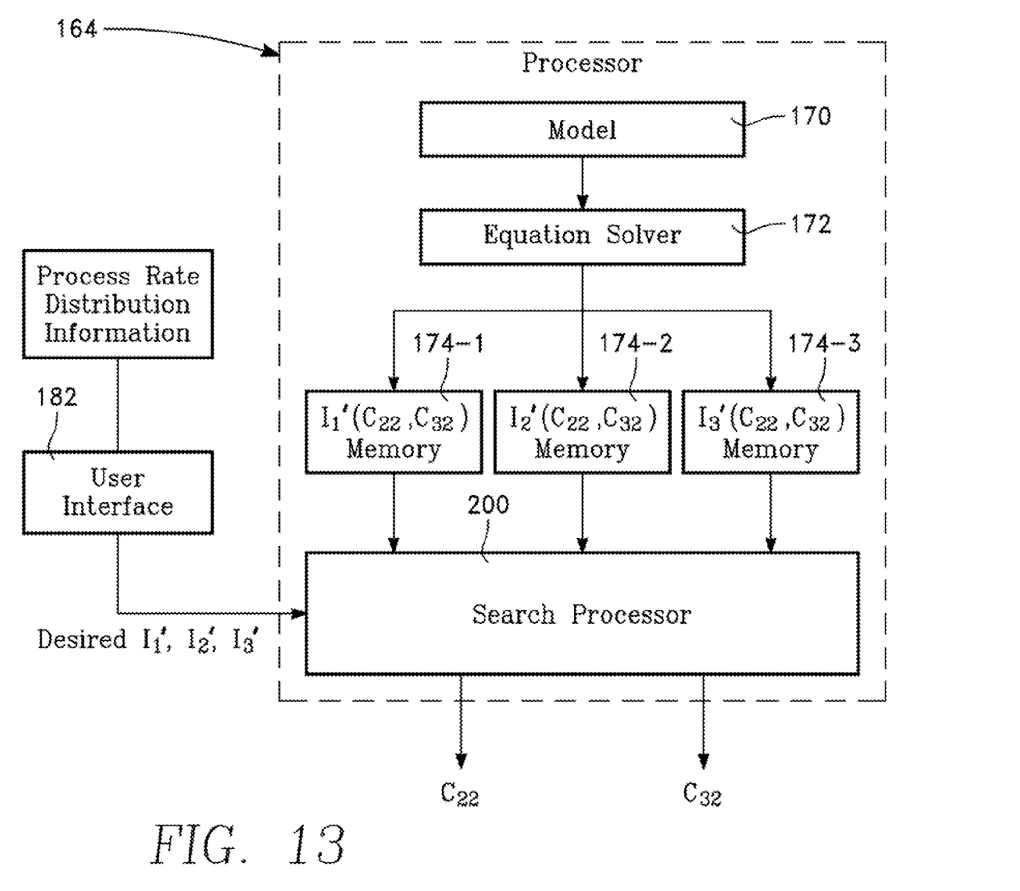
FIG. 13 is a schematic block diagram of an alternative embodiment of the processor of FIG. 4 that employs a search operation instead of a linear programming path.

FIG. 13 depicts a related embodiment, in which a linear programming path is not employed. Instead, in FIG. 13 the processor 164 includes a search processor 200 in place of the programmable path processor 176 of FIG. 4. The search processor 200 of FIG. 13 is adapted to search through the three 2-dimensional functions stored in the memories 174-1, 174-2 and 174-3 to find a pair of values of $C_{22}$ and $C_{32}$ that provides a set of discrete values of $I_1'$, $I_2'$ and $I_3'$ most closely resembling the desired values specified by the user interface 182. The user interface 182 may facilitate the selection of apportionment of the discrete values of $I_1'$, $I_2'$ and $I_3'$ by referring to process rate distribution information. Such information may reveal a pattern of non-uniformity in process rate distribution, enabling a user (or intelligent machine) to counteract a perceived non-uniformity pattern by selecting a countervailing pattern of the three coil currents.

In one embodiment, once the data in the memories 174-1, 174-2 and 174-3 are populated, the components 170 and 172 may be removed or deactivated for a more economical implementation. Such a reactor may be delivered with a set of tables stored in the memories 174-1, 174-2 and 174-3 to facilitate a range of chamber operating conditions and/or chamber geometries and/or source geometries.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
    a reactor chamber comprising a cylindrical side wall and a ceiling;
    an RF power generator and an impedance match coupled to said RF power generator;
    three coil antennas having respective driven ends and return ends, the return ends being connected to a common potential;
    a pair of current branches each comprising respective series and parallel reactance elements, the series reactance element of each of the current branches being coupled between said impedance match and the driven end of a respective one of said coil antennas, the parallel reactance element of each of the current branches being coupled in parallel with a respective one of said coil antennas;
    a third current branch coupled between said impedance match and the driven end of a third one of said three coil antennas; and
    a current apportionment controller governing reactances of said parallel reactance elements in accordance with a user-specified apportionment of currents among said coil antennas.

2. The reactor of claim 1 wherein said third current branch comprises a conductor.

3. The reactor of claim 1 wherein each one of said variable parallel reactance elements comprises a variable capacitor.

4. The reactor of claim 3 wherein each one of said series reactance elements comprises a capacitor.

5. The reactor of claim 1 wherein said current apportionment controller comprises:
    a look-up table storing a sequence of pairs of reactance values of said first and second variable parallel reactance elements.

6. The reactor of claim 5 wherein said sequence of pairs of values defines a linear programming sequence.

7. The reactor of claim 6 further comprising a user interface coupled to said current apportionment controller, said user interface adapted to record a user-selected point along said path and transmit said user-selected point to said current apportionment controller.

8. The reactor of claim 6 wherein said sequence of pairs of values defies a path in a 2-dimensional space whose dimensions are the reactance values of said variable parallel reactance elements, respectively.

9. The reactor of claim 8 wherein said path includes:
a reference point at which currents in said three RF coil antennas are at least approximately equal,
a first point at which current in a first one of said coil antennas, relative to currents in second and third ones of said coil antennas, is near a maximum,
a second point at which current in said second coil antenna, relative to currents in said first and third coil antennas, is near a maximum, and
a third point at which current in said third coil antenna, relative to currents in said first and second coil antennas, is near a maximum.

10. The reactor of claim 1 further comprising:
an interface for entering said user-specified apportionment of currents in said three coil antennas;
wherein said current apportionment controller comprises:
a memory containing data representing respective currents in said three RF coil antennas relative to total current as functions of values of said variable parallel reactive elements;
a processor for determining from said data the values of said variable parallel reactance elements at which said respective currents in said three coil antennas at least nearly correspond to said user-specified apportionment.

11. The reactor of claim 1 wherein:
said impedance match comprises a match input and a match output and said RF generator comprises a power terminal coupled to said match input and a return terminal connected to said common potential;
said impedance match further comprises:
a first section comprising:
a first variable tuning capacitor connected to said match input and a first tuning inductor connected in series between said first variable tuning capacitor and said match output;
a second tuning inductor connected in parallel with the combination of said first variable tuning capacitor and said first tuning inductor;
a second section comprising:
a second variable tuning capacitor connected to said match input and a third tuning inductor connected in series between said second variable tuning capacitor and said common potential.

12. The reactor of claim 11 further comprising:
an SWR detector coupled to said power terminal;
a match controller responsive to said SWR detector and governing said first and second variable tuning capacitors.

13. A method of individually controlling currents in three coils of a plasma reactor supplied from an RF generator output node of a single RF power generator through a single RF impedance match, comprising:
providing parallel current divider branches between an output node of said RF generator and respective ones of said coils, each one of at least two of said current divider branches comprising a series reactance element connected between said RF generator output node and a respective one of said coils and a variable parallel reactance element connected in parallel with said respective coil;
providing a model comprising a first set of equations defining voltage drops in said parallel branches in accordance with mutual inductances of said coils and corresponding portions of a plasma in said reactor and a second set of equations defining voltage drops in said corresponding portions of said plasma in accordance with said mutual inductances;
solving said first and second sets of equations for currents in said coils relative to total current as 3-dimensional functions of reactance values of said variable parallel reactance elements in said at least two current divider branches;
correlating information corresponding to said functions to a user-defined apportionment of currents in said coils.

14. The method of claim 13 wherein said correlating comprises:
searching said functions for respective points in a space representing pairs of values of said variable parallel reactance elements at which coil currents are maximum for respective ones of said coils;
defining a linear programming path that includes said respective points;
responding to a user selection of a location on said linear programming path by controlling impedance values of said variable impedance elements in accordance with said location.

15. The method of claim 14 wherein said path further includes a point at which all coil currents are at least nearly the same.

16. The method of claim 15 wherein said path comprises straight segments between said points.

17. The method of claim 13 wherein said correlating comprises:
searching said functions for a set of reactance values of said variable parallel reactance elements corresponding to an apportionment of currents among said coils that at least nearly approximates said user-defined apportionment.

18. A method of individually controlling currents in three coils of a plasma reactor supplied from an RF generator output node of an RF power generator through an RF impedance match, comprising:
providing parallel current divider branches between an output node of said RF generator and respective ones of said coils, at least two of said current divider branches comprising a series reactance element connected between said RF generator output node and a respective one of said coils and a variable parallel reactance element connected in parallel with said respective coil;
correlating information, corresponding to coil currents as 3-dimensional functions of reactance values of said variable parallel reactance elements in said at least two current divider branches, to a user-defined apportionment of currents in said coils.

19. The method of claim 18 wherein said correlating comprises:
defining respective points in a space representing pairs of values of said variable parallel reactance elements at which coil currents are maximum for respective ones of said coils;
defining a linear programming path that includes said respective points;

responding to a user selection of a location on said linear programming path by controlling impedance values of said variable impedance elements in accordance with said location.

20. The method of claim 19 wherein said path further includes a point at which all coil currents are at least nearly the same.

* * * * *